(12) United States Patent
Shiba et al.

(10) Patent No.: US 8,304,177 B2
(45) Date of Patent: Nov. 6, 2012

(54) PROCESS FOR PRODUCING INK JET HEAD

(75) Inventors: Shoji Shiba, Yokohama (JP); Masumi Ikeda, Nishinomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/219,446

(22) Filed: Aug. 26, 2011

(65) Prior Publication Data
US 2012/0058433 A1 Mar. 8, 2012

(30) Foreign Application Priority Data

Sep. 8, 2010 (JP) ................. 2010-201016

(51) Int. Cl.
*B41J 2/16* (2006.01)
(52) U.S. Cl. ........................ 430/320; 430/330
(58) Field of Classification Search ........................ None
See application file for complete search history.

(56) References Cited

U.S. PATENT DOCUMENTS

| | | | |
|---|---|---|---|
| 4,657,631 A | 4/1987 | Noguchi | |
| 4,663,640 A | 5/1987 | Ikeda | |
| 5,331,344 A * | 7/1994 | Miyagawa et al. | 347/65 |
| 5,524,784 A | 6/1996 | Shiba et al. | |
| 5,663,752 A | 9/1997 | Imamura et al. | |
| 5,922,401 A | 7/1999 | Kashiwazaki et al. | |
| 6,277,294 B1 | 8/2001 | Ozaki et al. | |
| 6,312,771 B1 | 11/2001 | Kashiwazaki et al. | |
| 6,331,259 B1 | 12/2001 | Ozaki et al. | |
| 6,375,312 B1 | 4/2002 | Ikeda et al. | |
| 6,382,775 B1 | 5/2002 | Kubota et al. | |
| 6,461,798 B1 * | 10/2002 | Ohkuma et al. | 430/320 |
| 7,175,973 B2 | 2/2007 | Okano et al. | |

FOREIGN PATENT DOCUMENTS

| | | |
|---|---|---|
| JP | 2-140219 A | 5/1990 |
| JP | 6-45242 B2 | 6/1994 |
| JP | 6-286149 A | 10/1994 |
| JP | 2009-15194 A | 1/2009 |

OTHER PUBLICATIONS

Ishizuka, et al., U.S. Appl. No. 13/281,124, filed Oct. 25, 2011.

* cited by examiner

*Primary Examiner* — John A. McPherson
(74) *Attorney, Agent, or Firm* — Fitzpatrick, Cella, Harper & Scinto

(57) ABSTRACT

A process for producing an ink jet head, including forming an ink flow path pattern whose surface has been subjected to insolubilization treatment on a substrate having an energy-generating element, applying a UV curable flow path forming material on the pattern and substrate to form an ink flow path forming layer, irradiating part of the ink flow path forming layer with ultraviolet rays for development, thereby forming an ink ejection orifice, and removing the pattern, thereby forming an ink flow path. The step of forming the pattern includes applying a positive resist containing a resin having a phenolic hydroxyl group on the substrate to form a positive resist layer, patterning the positive resist layer to form an ink flow path pattern prior to insolubilization treatment, applying a coating agent containing a compound having two vinyl ether groups on the pattern, and heat-treating the pattern coated with the coating agent.

10 Claims, 3 Drawing Sheets

PROCESS FOR PRODUCING INK JET HEAD

BACKGROUND OF THE INVENTION

1. Field of the Invention

The present invention relates to a process for producing an ink jet head.

2. Description of the Related Art

An ink jet head applied to an ink jet recording system generally has an ink flow path, an energy-generating portion provided in a part of the ink flow path, and minute ink ejection orifice for ejecting an ink by the energy of the energy-generating portion. As a process for producing such an ink jet head, is known a process disclosed in, for example, Japanese Patent Publication No. H06-45242. According to this process, an ink flow path pattern which will become a mold of an ink flow path is formed with a photosensitive resin material on a substrate on which energy-generating elements have been formed as an energy-generating portion. A coating resin layer which will become a nozzle material is formed on the substrate so as to coat the ink flow path pattern. Ink ejection orifices communicating with the ink flow path pattern are formed in the coating resin layer. Thereafter, the ink flow path pattern is removed to form the ink flow path, thereby producing an ink jet head.

Japanese Patent Application Laid-Open No. H06-286149 discloses that a positive resist composed of a vinyl ketone type photodegradable polymer compound such as poly (methyl isopropenyl ketone) or poly(vinyl ketone) is used as the photosensitive resin material for forming the ink flow path pattern. Such a positive resist is polymeric and is hence excellent in resistance to a solvent upon the coating and formation of the coating resin layer which will become a nozzle material and hard to cause pattern break down. In addition, the molecular weight of this resist is lowered by light irradiation upon the removal of the ink flow path pattern, and so the resist can be easily dissolved and removed with an organic solvent.

On the other hand, with the miniaturization of semiconductor integrated circuits in recent years, attention is paid to a double patterning method in which patterning is repeated twice as a method for obtaining a fine resist pattern. In this method, a patterned resist is coated with a resist again to repeat the patterning, so that the resist first patterned is required to have solvent resistance. As a method for imparting the solvent resistance to the resist pattern, is disclosed a method in which a compound having an isocyanate group or a functional group which forms an isocyanate group by heating is applied to the surface of a pattern formed of, for example, a chemically amplified positive resist, followed by baking (Japanese Patent Application Laid-Open No. 2009-15194).

However, the positive resist composed of the vinyl ketone type photodegradable polymer compound such as poly(methyl isopropenyl ketone) or poly(vinyl ketone) requires a lot of energy for its degradation reaction and thus has extremely low sensitivity. On the other hand, an alkali-developing positive resist containing a resin such as polyhydroxystyrene or phenolic novolak as a main component is a resist which forms an image by utilizing a polarity change and thus is high in sensitivity and resolution. Therefore, such a resist is widely used in the field of semiconductors. However, the alkali-developing positive resist is low in solvent resistance because it contains the resin having a phenolic hydroxyl group as the main component. Therefore, when such a resist is applied to the material of the ink flow path pattern in the production of the ink jet head, pattern break down may be caused in some cases upon the coating and formation of the coating resin layer which will become the nozzle material. Since the chemically amplified positive resist has extremely high sensitivity and excellent resolution, it is suitable for use as a material for forming the ink flow path pattern in the production of the ink jet head. When a pattern formed of the chemically amplified positive resist is treated by utilizing a chemical reaction by the isocyanate group according to the method described in Japanese Patent Application Laid-Open No. 2009-15194, a cured component is formed on the surface of the resist pattern, and so the resistance to the solvent upon the coating and formation of the coating resin layer which will become the nozzle material becomes sufficient. However, it is difficult to dissolve and remove this resist pattern with an organic solvent. This is because the cured component formed on the surface of the resist pattern does not cause a photo-degradation reaction and thus is low in solubility in organic solvents.

SUMMARY OF THE INVENTION

It is an object of the present invention to solve the above problems and provide a process for producing an ink jet head by applying a positive resist excellent in sensitivity and resolution to the production of the ink jet head, by which deformation of an ink flow path and ink ejection orifice or the remains of the resist are not caused.

According to the present invention, there is provided a process for producing an ink jet head, comprising a step of forming an ink flow path pattern whose surface has been subjected to an insolubilization treatment on a substrate having an energy-generating element, a step of applying a flow path forming material that cures by ultraviolet ray irradiation on the ink flow path pattern whose surface has been subjected to the insolubilization treatment and on the substrate to form an ink flow path forming layer, a step of irradiating a part of the ink flow path forming layer with ultraviolet rays to conduct development, thereby forming an ink ejection orifice, and a step of removing the ink flow path pattern whose surface has been subjected to the insolubilization treatment, thereby forming an ink flow path, wherein the step of forming the ink flow path pattern whose surface has been subjected to the insolubilization treatment includes a step of applying a positive resist containing a resin having at least a phenolic hydroxyl group on the substrate to form a positive resist layer, a step of patterning the positive resist layer to form an ink flow path pattern prior to the insolubilization treatment, a step of applying a coating agent containing a compound having at least two vinyl ether groups on the ink flow path pattern and a step of heat-treating the ink flow path pattern coated with the coating agent.

Further features of the present invention will become apparent from the following description of exemplary embodiments with reference to the attached drawings.

DESCRIPTION OF THE EMBODIMENTS

Figure 1:
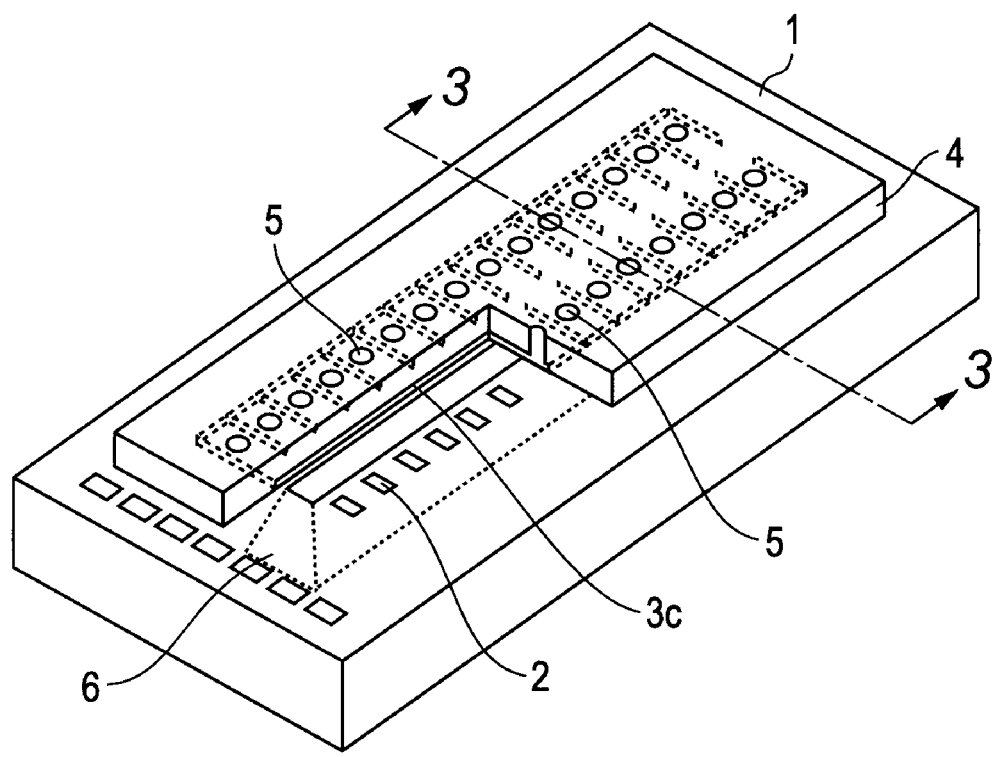
FIG. 1 typically illustrates an exemplary ink jet head according to the present invention.

Preferred embodiments of the present invention will now be described in detail in accordance with the accompanying drawings. Incidentally, in the following description, the same reference number (sign) is assigned to a structure having the same function in the drawings, and the description thereof may be omitted in some cases.

Figure 2:
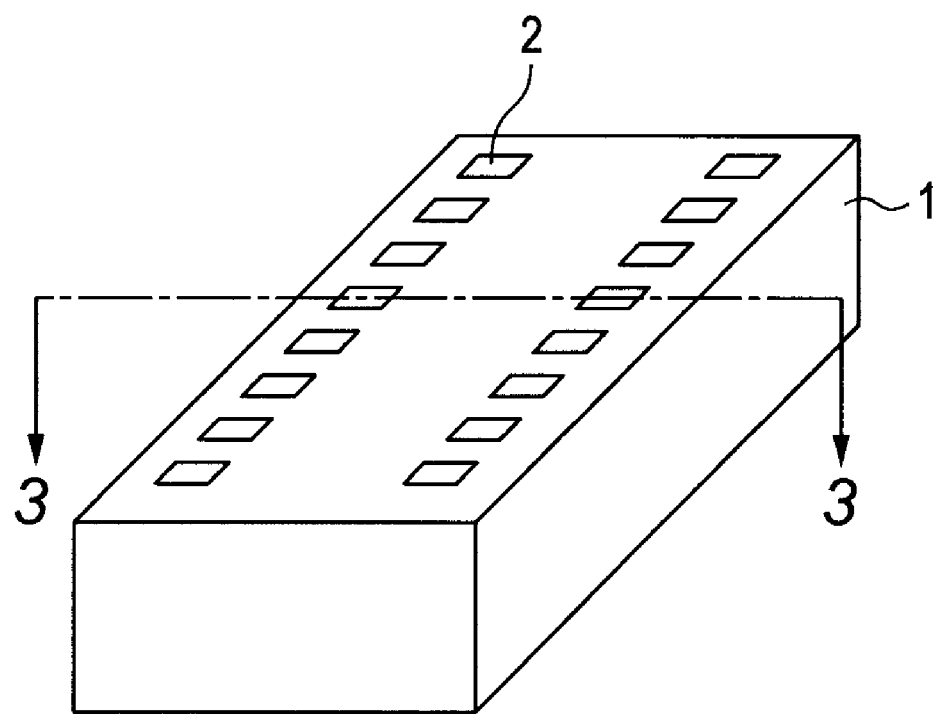
FIG. 2 typically illustrates an exemplary substrate of the ink jet head according to the present invention.

FIG. 1 is a partly perspective typical sectional view illustrating an exemplary ink jet head produced by the production process of the ink jet head according to the present invention. The ink jet head in FIG. 1 has, on a substrate 1 having a plurality of energy-generating elements 2, an ink flow path 3c which holds ink, an ink ejection orifice 5 which communicates with the ink flow path 3c and can eject ink, and an ink flow path forming layer 4 in which the ink flow path 3c and the ink ejection orifice 5 are formed. In addition, the substrate 1 is provided with an ink supply port 6 capable of supplying ink to the ink flow path 3c. As illustrated in FIG. 2, the plurality of the energy-generating elements 2 are arranged at a predetermined pitch on the substrate 1. In FIGS. 3A to 3H, exemplary respective steps of the production process of the ink jet head according to the present invention are illustrated in terms of sectional views taken along line 3-3 in FIGS. 1 and 2. The respective steps of the production process of the ink jet head according to the present invention will hereinafter be described with reference to FIGS. 3A to 3H. Incidentally, the following Steps A to H correspond to FIG. 3A to 3H, respectively.

Figure 3A:
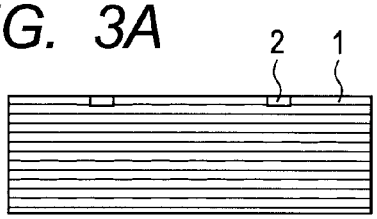
FIGS. 3A, 3B, 3C, 3D, 3E, 3F, 3G and 3H are sectional views illustrating an exemplary process for producing the ink jet head according to the present invention.

Steps A and B:

A substrate 1 in which an energy-generating element 2 has been formed is first provided (FIG. 3A). A silicon substrate is favorably applied to the substrate 1 because a driver for controlling the energy-generating element 2 and a logic circuit are produced by a general-purpose semiconductor producing process. No particular limitation is imposed on the energy-generating element 2 on the substrate so far as ejection energy for ejecting ink can be given to the ink to eject the ink from the ejection orifice 5. For example, when a heating resistor element is used as the energy-generating element, the heating resistor element heats an ink present in the vicinity thereof, thereby causing the ink to bring about a change of state to generate ejection energy. Incidentally, a control signal input electrode (not illustrated) for operating the element is connected to the energy-generating element 2.

Figure 3B:
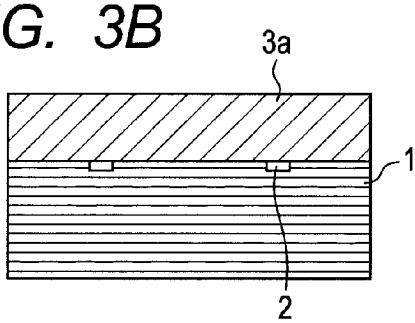

A positive resist is then applied on the substrate 1 to form a positive resist layer 3a (FIG. 3B). As the positive resist, is used a positive resist containing a resin having at least a phenolic hydroxyl group. The phenolic hydroxyl group is a functional group functioning for forming a crosslinked structure with a vinyl ether group upon a treatment with a coating agent containing a compound having at least two vinyl ether groups in Step D which will be described subsequently. Examples of the positive resist containing the resin having the phenolic hydroxyl group include positive resists of a naphthoquinonediazide (NQD) type containing a phenolic novolak resin, a polyhydroxystyrene resin or a copolymer thereof as a base as well as a chemically amplified type. In the present invention, the positive resist of the chemically amplified type (chemically amplified positive resist) is favorably used from the viewpoint of ease of dissolution and removal in the step which will be described later.

As the positive resist of the NQD type, may be used a positive resist containing the above-described resin and a naphthoquinonediazide derivative as a dissolution inhibitor causing a structure change by light irradiation.

The chemically amplified positive resist favorably contains such a resin that a part of the phenolic hydroxyl group of the above-described resin is protected with a substituent decomposable by an acid (resin having a partially protected phenolic hydroxyl group) and a compound which generates an acid by light irradiation (photoacid generator). In addition, a chemically amplified positive resist containing the above-described resin, an additive as a dissolution inhibitor which is decomposed by an acid to form a hydroxyl group or carboxyl group, and a photoacid generator may also be used. Further, the chemical amplified positive resist favorably contains the above-described resin or the resin having the partially protected phenolic hydroxyl group, a crosslinking agent capable of reacting with the phenolic hydroxyl group to form a crosslinked structure decomposable by an acid, and a photoacid generator for the purpose of further improving the solvent resistance.

Examples of the resin having the partially protected phenolic hydroxyl group include compounds having the structure represented by the following formula (1) or (2). Incidentally, n in the following formulae (1) and (2) is a positive integer.

Formula (1):

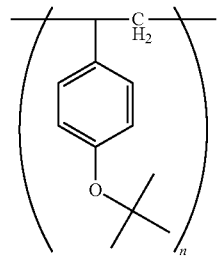

Formula (2):

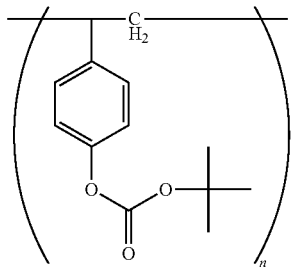

As the crosslinking agent, is favorable a compound having at least two vinyl ether groups represented by the following formula (3).

Formula (3):

With the chemically amplified positive resist containing the crosslinking agent, the phenolic hydroxyl group is caused to react with the crosslinking agent by a heat treatment after applied on the substrate 1 to form an acetal bond. The solvent resistance is thereby improved. On the other hand, the acetal bond is broken by the action of an acid formed from the photoacid generator at a portion irradiated with light in the step which will be described subsequently, whereby this portion functions as a positive resist.

Examples of the compound having at least two vinyl ether groups include divinyl ethers such as triethylene glycol divinyl ether, tetramethylene glycol divinyl ether, tetraethylene glycol divinyl ether and neopentyl glycol ethoxylate divinyl ether; trivinyl ethers such as trimethylolpropane ethoxylate trivinyl ether, trimethylolethane ethoxylate trivinyl ether, pentaerythritol ethoxylate trivinyl ether, trimethylol-propane ethoxyethoxylate trivinyl ether and trimethylolpropane ethoxyethoxyethoxylate trivinyl ether; and pentavinyl ethers such as erythritol ethoxylate pentavinyl ether. These may be used either singly or in any combination thereof.

Examples of a process for forming the positive resist layer $3a$ include a process of applying the above-described positive resist on the substrate 1 by a spin coating method and then removing the solvent by heating to form the positive resist layer $3a$. Since the thickness of the positive resist layer $3a$ corresponds to the height of the ink flow path $3c$, the thickness may be suitably selected according to the height of the ink flow path $3c$. However, the thickness is favorably, for example, 2 to 50 μm.

Figure 3C:
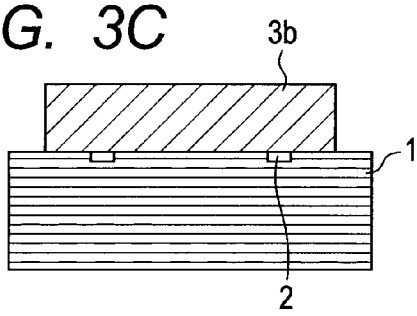

Step C:

The positive resist layer $3a$ is irradiated with ultraviolet rays through a photomask (not illustrated), subjected to PEB (post exposure baking) as needed and then developed, thereby patterning the positive resist layer $3a$. An ink flow pass pattern $3b$ prior to an insolubilization treatment is thereby formed (FIG. 3C). For example, an alkaline aqueous solution such as an aqueous solution of tetramethylammonium hydroxide may be used in the development. In addition, the developed layer may also be subjected to a rinsing treatment with pure water.

Figure 3D:
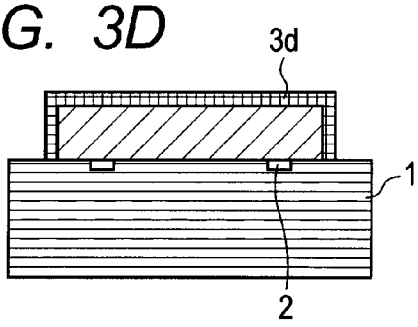

Step D:

The ink flow pass pattern $3b$ prior to the insolubilization treatment is subjected to the insolubilization treatment for the purpose of improving the solvent resistance of the ink flow pass pattern $3b$ prior to the insolubilization treatment. Specifically, the ink flow pass pattern $3b$ prior to the insolubilization treatment is coated with a coating agent containing a compound having at least two vinyl ether groups and heat-treated. An ink flow pass pattern $3d$ subjected to the insolubilization treatment is thereby formed (FIG. 3D).

Examples of the compound having at least two vinyl ether groups contained in the coating agent include divinyl ethers such as triethylene glycol divinyl ether, tetramethylene glycol divinyl ether, tetraethylene glycol divinyl ether and neopentyl glycol ethoxylate divinyl ether; trivinyl ethers such as trimethylolpropane ethoxylate trivinyl ether, trimethylolethane ethoxylate trivinyl ether, pentaerythritol ethoxylate trivinyl ether, trimethylol-propane ethoxyethoxylate trivinyl ether and trimethylolpropane ethoxyethoxyethoxylate trivinyl ether; and pentavinyl ethers such as erythritol ethoxylate pentavinyl ether. These may be used either singly or in any combination thereof.

The coating agent may contain the compound having at least two vinyl ether groups and a solvent capable of dissolving the compound therein. As the solvent, may be used any of organic solvents such as, for example, alcohols, ketones, glycols and aromatic solvents. These solvents may be used either singly or in any combination thereof. The coating agent may further contain a resin component for the purpose of improving the film-forming ability of the coating agent. As the resin component, may be used a resin high in film-forming ability and soluble in the solvent. However, such a component is required not to have a functional group reacting with the vinyl ether group. Examples of the functional group reacting with the vinyl ether group include a phenolic hydroxyl group and an epoxy group. Examples of the resin which does not have the functional group reacting with the vinyl ether group include acrylic resins such as polymethyl methacrylate, polyvinyl alcohol, and polystyrene.

Examples of a method for applying the coating agent on the ink flow path pattern $3b$ prior to the insolubilization treatment include a method of applying the coating agent by a spin coating method and a method of immersing the substrate 1 in the coating agent. After the coating agent is applied on the ink flow path pattern $3b$ prior to the insolubilization treatment, a heat treatment is conducted. The vinyl ether groups of the compound contained in the coating agent are thereby caused to react with the phenolic hydroxyl group of the ink flow path pattern $3b$ prior to the insolubilization treatment to form an acetal bond, thereby improving the solvent resistance. The temperature of the heat treatment is favorably 50 to 200° C., more favorably 80 to 180° C. The temperature of the heat treatment is controlled to 200° C. or less, whereby the deformation or pattern break down of the ink flow path pattern by the heating can be prevented. The temperature of the heat treatment is controlled to 50° C. or more, whereby the crosslinking reaction between the vinyl ether group and the phenolic hydroxyl group is easy to proceed, so that the solvent resistance can be improved.

As needed, a washing treatment is then conducted for the purpose of removing the coating agent attached to other portions than the ink flow path pattern $3d$ subjected to the insolubilization treatment. As a washing liquid used in the washing treatment, any liquid may be used so far as the compound having at least two vinyl ether groups and the resin component that are contained in the coating agent can be dissolved therein. However, the solvent contained in the coating agent is favorably used. After the washing treatment is conducted, drying under heat may be conducted as needed.

In addition, a material which absorbs ultraviolet rays applied in the step of forming the ink ejection orifice 5, which will be described subsequently, is favorably applied on the ink flow pass pattern $3b$ prior to the insolubilization treatment or the ink flow pass pattern $3d$ subjected to the insolubilization treatment. This is a particularly favorable mode when the ink ejection orifice 5 does not follow the desired pattern. As a result of an extensive investigation by the present inventors, it was supposed that the deformation of the pattern form of the ink ejection orifice 5 is caused by the situation that ultraviolet rays unevenly move around to an unexposed portion due to reflection of the ultraviolet rays on the surface of the substrate 1 when pattern exposure is conducted by ultraviolet ray irradiation, and this portion is slightly cured. Thus, by absorbing the ultraviolet rays unevenly that move around to the unexposed portion due to the reflection on the surface of the substrate 1 when the pattern exposure is conducted by ultraviolet ray irradiation with a material that absorbs the ultraviolet rays, the deformation of the ink ejection pattern can be inhibited. For example, when the ultraviolet rays applied in the step of forming the ink ejection orifice 5 are the i-line (wavelength: 365 nm), a material absorbing the i-line is used as the material absorbing the ultraviolet rays.

No particular limitation is imposed on the absorbance of the material absorbing the ultraviolet rays so far as it is an absorbance capable of absorbing the ultraviolet rays that unevenly move around to the unexposed portion due to the reflection on the surface of the substrate 1 to form a desired pattern of the ink ejection orifice 5. However, the absorbance to the ultraviolet rays applied in the step of forming the ink ejection orifice 5 is favorably 0.2 or more in terms of the absorbance of the entire pattern to the thickness-wise direction. Here, the absorbance of the entire pattern to the thickness-wise direction is the total value of the absorbance of the positive resist forming the ink flow pass pattern $3b$ prior to the insolubilization treatment or the ink flow pass pattern $3d$ subjected to the insolubilization treatment and the absorbance of the material absorbing the ultraviolet rays. This absorbance is more favorably 0.3 or more, still more favorably 0.4 or more. The absorbance is controlled to 0.2 or more, whereby the deformation of the pattern of the ink ejection orifice 5 can be sufficiently inhibited.

The material absorbing the ultraviolet rays is favorably a compound having one or more phenolic hydroxyl groups. The compound has the phenolic hydroxyl group, whereby this compound can be bonded to the compound having at least two vinyl ether groups contained in the coating agent. When this bond is formed, the material absorbing the ultraviolet rays can be prevented from being dissolved out and being mixed into the flow path forming material. In addition, the material absorbing the ultraviolet rays is more favorably a compound having two or more phenolic hydroxyl groups because this material is harder to be dissolved out by increasing the bonding points.

Examples of the compound absorbing the i-line and having one or more phenolic hydroxyl groups include benzophenones such as 4-hydroxybenzophenone, 4,4'-dihydroxybenzophenone and 2,3,4-trihydroxybenzophenone; naphthoquinones such as 5-hydroxy-1,4-naphthoquinone and 5,8-dihydroxy-1,4-naphthoquinone; anthraquinones such as 1-hydroxyanthraquinone, 1,2-dihydroxyanthraquinone (alizarin), 1,4-dihydroxyanthraquinone (quinizarin), 1,5-dihydroxy-anthraquinone (anthrarufin), 2,6-dihydroxyanthraquinone (anthraflavic acid) and 1,2,4-trihydroxyanthraquinone (purpurin); anthracenes such as 1,8,9-trihydroxyanthracene and 1,4,9,10-tetrahydroxyanthracene, and 2-hydroxy-9-fluorenone. These may be used either singly or in any combination thereof. Other compounds than these compounds may be used so far as they do not depart from the subject matter of the present invention.

As a method for applying the material absorbing the ultraviolet rays on the ink flow pass pattern 3b prior to the insolubilization treatment or the ink flow pass pattern 3d subjected to the insolubilization treatment, may be used various methods. Examples thereof include a method of applying a solution of the material absorbing the ultraviolet rays by a spin coating method and a method of immersing the substrate 1 in this solution. At this time, heating may be conducted, or the pH of the solution may be adjusted in such a manner that the diffusion of the solution into the interior of the ink flow pass pattern 3b prior to the insolubilization treatment or the ink flow pass pattern 3d subjected to the insolubilization treatment is caused to proceed. Other methods than these methods may be used so far as they do not depart from the gist of the present invention. Thereafter, as needed, washing with water and/or various organic solvents may be conducted for the purpose of removing the material absorbing the ultraviolet rays which has been applied to other portions than the ink flow pass pattern 3b prior to the insolubilization treatment or the ink flow pass pattern 3d subjected to the insolubilization treatment.

Incidentally, either one of the step of applying the coating agent and the step of applying the material absorbing the ultraviolet rays may be conducted first, or both steps may be conducted at the same time. Examples of a method for conducting both steps at the same time include a method of applying a solution with the material absorbing the ultraviolet rays and the coating agent dissolved by a spin coating method and a method of immersing the substrate in the solution with the material absorbing the ultraviolet rays and the coating agent dissolved. In addition, the removal of the excess of the material absorbing the ultraviolet rays and the removal of the excess of the coating agent may be conducted at the same time. Besides this order of the steps, the steps of applying and removing the material absorbing the ultraviolet rays and the steps of applying and removing the coating agent may be conducted by changing their orders within the scope not departing from the gist of the present invention. Further, these steps may be conducted repeatedly.

Figure 3E:
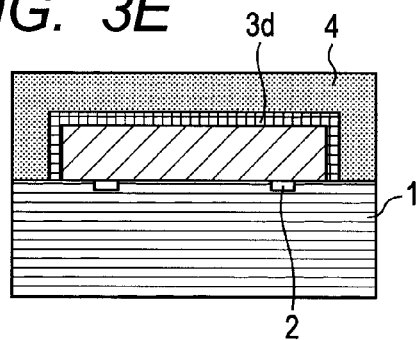

Step E:

A flow path forming material which cures by ultraviolet ray irradiation is applied on the ink flow path pattern 3d subjected to the insolubilization treatment and on the substrate 1 to form an ink flow path forming layer 4 (FIG. 3E). As the flow path forming material which cures by ultraviolet ray irradiation, is favorable a photocationic polymerization type photosensitive resin composition containing a cationically polymerizable resin having a cationically polymerizable group and a photocationic polymerization initiator. Examples of the cationically polymerizable resin having the cationically polymerizable group include epoxy resins and oxetane resins.

Examples of the epoxy resins include those reaction products of bisphenol A and epichlorohydrin which have a molecular weight of 900 or more, and reaction products of bromine-containing bisphenol A and epichlorohydrin. In addition, reaction products of phenolic novolak or o-cresol novolak and epichlorohydrin, and polyfunctional epoxy resins having an oxycyclohexane skeleton described in Japanese Patent Application Laid-Open No. H02-140219 may also be mentioned. However, the epoxy resins are not limited to these resins. The epoxy equivalent of the epoxy resin is favorably 2,000 or less, more favorably 1,000 or less. When the epoxy equivalent is 2,000 or less, sufficient adhesion and ink resistance can be achieved without lowering the crosslink density upon a curing reaction.

As the photocationic polymerization initiator for curing the epoxy resin, may be used a compound generating an acid by ultraviolet ray irradiation (photoacid generator). Specific examples thereof include aromatic sulfonium salts and aromatic iodonium salts. More specifically, SP-150, SP-170 and SP-172 (all, trade names, products of ADEKA CORPORATION), and DTS-103 and NDS-103 (both, trade names, products of Midori Kagaku Co., Ltd.) may be suitably used.

As needed, additives may be suitably added to the photocationic polymerization type photosensitive resin composition. Examples of the additives include flexibilizers for lowering the elastic modulus of the epoxy resin, silane coupling agents for improving the adhesion to a substrate and sensitizers for conducting wavelength sensitization.

Examples of a method for forming the ink flow path forming layer 4 include a method in which the flow path forming material that cures by ultraviolet ray irradiation is dissolved in an organic solvent, and the solution is applied by a spin coating method followed by prebaking to form the ink flow path forming layer 4. As the organic solvent used as a coating solvent, alcoholic solvents such as ethanol and isopropyl alcohol, ketone solvents such as acetone, methyl isobutyl ketone, diisobutyl ketone and cyclohexanone, aromatic solvents such as toluene, xylene and mesitylene, and solvents such as ethyl lactate, propylene glycol monomethyl ether, diethylene glycol monomethyl ether and diethylene glycol dimethyl ether may be used either singly or in any combination thereof. The thickness of the ink flow path forming layer 4 is favorably 3 μm or more in terms of the thickness on the ink flow path pattern 3d subjected to the insolubilization treatment because the wall of an ink flow path is required to have some mechanical strength. No particular limitation is imposed on the upper limit of this thickness so far as it is within a range not impeding the developability of the ink ejection orifice 5 to be formed in a subsequent step. In addition, surface modification treatment such as a water-repellent treatment or hydrophilization treatment may be conducted on the ink flow path forming layer 4 as needed.

Figure 3F:
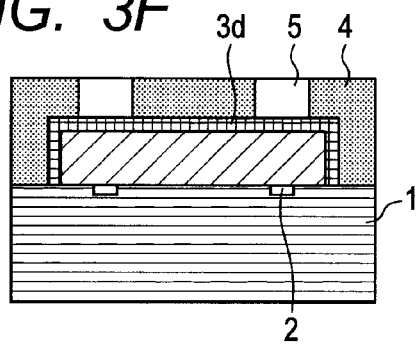

Step F:

A part of the ink flow path forming layer 4 is irradiated with ultraviolet rays to conduct development, thereby forming the ink ejection orifice 5 (FIG. 3F). As a developer used in the development, may be used MIBK (methyl isobutyl ketone) or xylene. A rinsing treatment with IPA (isopropyl alcohol) and post baking may be conducted as needed.

No particular limitation is imposed on an apparatus used in the ultraviolet ray irradiation so far as a desired pattern can be formed. However, a stepper (reduction projection type exposure apparatus) is favorably used from the viewpoint of alignment accuracy, and an i-line stepper that is commonly used is more favorably used. As the ultraviolet rays applied in the step of forming the ink ejection orifice 5, is suitably used the i-line (wavelength: 365 nm).

Figure 3G:
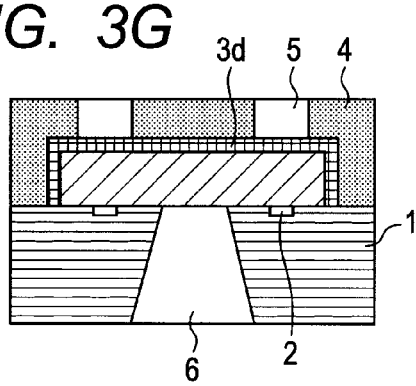

Step G:

An ink supply port 6 passing through the substrate 1 is formed (FIG. 3G). As a method for forming the ink supply port 6, may be used a method such as sand blasting, dry etching or wet etching, or a combination of these methods. Anisotropic etching using, for example, an aqueous solution of potassium hydroxide, sodium hydroxide or tetramethylammonium hydroxide, which is an alkaline etchant, is described. In a silicon substrate having the <100> or <110> orientation as crystal orientation, a depth direction and a width direction can be selected as the advancing direction of etching, thereby obtaining the anisotropy of etching. In particular, in a silicon substrate having the <100> crystal orientation, the depth to be etched is geometrically determined according to the width of etching, so that the depth of etching can be controlled. For example, a hole that narrows at an inclination of 54.7° in the depth direction from the starting surface of etching can be formed. A proper resin material or inorganic film having etchant resistance is used as a mask to conduct the anisotropic etching, whereby the ink supply port 6 passing through the substrate 1 can be formed. Incidentally, in order to protect the respective resin layers on the surface of the substrate 1 from the etchant, the whole surface of the ink flow path forming layer 4 may be covered with a protecting film having etchant resistance.

Figure 3H:
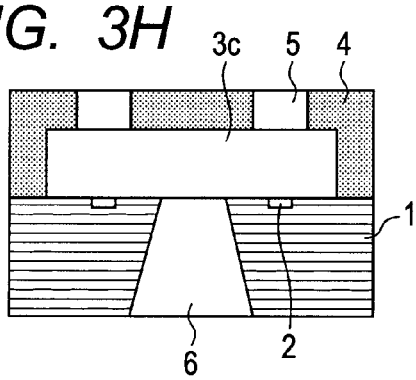

Step H:

An ink flow path 3c communicating with the ink ejection orifice 5 is formed by removing the ink flow path pattern 3d subjected to the insolubilization treatment (FIG. 3H). As a method for removing the ink flow path pattern 3d subjected to the insolubilization treatment, it is favorable to irradiate the ink flow path forming layer 4 with ultraviolet rays including the sensitizing wavelength of the positive resist used in Step B, conduct a heat treatment, as needed, to cause a decomposition reaction to proceed, and then dissolve and remove the ink flow path pattern 3d with a solvent.

For example, when the positive resist of the NQD type is used as the positive resist and the photocationic polymerization type photosensitive resin composition is used as the flow path forming material, the removal by dissolution becomes feasible because a cation (proton) is generated from the photocationic polymerization initiator remaining in the photocationic polymerization type photosensitive resin composition by the ultraviolet ray irradiation to promote the decomposition of the acetal bond formed by the reaction between the vinyl ether group and the phenolic hydroxyl group. When the chemically amplified positive resist is used as the positive resist, a cation (proton) is generated in the interior of the positive resist by the ultraviolet ray irradiation to decompose the acetal bond in addition to the above-described effect, so that the ink flow path pattern 3d can by easily dissolved and removed.

Thereafter, the ink flow path forming layer 4 is completely cured by conducting a heat treatment, as needed, after conducting a step of cutting and separating the substrate 1 (not illustrated). Junction of a member for supplying an ink (not illustrated) and electrical junction for driving the energy-generating element 2 (not illustrated) are achieved to complete an ink jet head. In the ink jet head produced by the process according to the present invention, deformation of the ink ejection orifice 5 and the ink flow path 3c is inhibited, and the residue of the resist is not present in the ink ejection orifice 5 and the ink flow path 3c.

The present invention will hereinafter be described in more detail by the following Examples. However, the present invention is not limited to these Examples.

Example 1

An ink jet head was produced according to the steps illustrated in FIGS. 3A to 3H. A substrate 1 illustrated in FIG. 3A was first provided. In this Example, an 8-inch silicon substrate provided with an electrothermal conversion element (heaters composed of $HfB_2$) as an energy-generating element 2 on the silicon substrate and a laminated film (not illustrated) of SiN+Ta at forming sites for an ink flow path 3c and an ink flow path forming layer 4 was provided.

An iP-5700 resist (trade name, product of TOKYO OHKA KOGYO CO., LTD.) that is a positive resist of the NQD type was applied on the substrate 1 by a spin coating method. Thereafter, baking was conducted for 3 minutes at 90° C., thereby forming a positive resist layer 3a (FIG. 3B). Incidentally, the film thickness of the positive resist layer 3a after the baking was 7 μm.

The positive resist layer 3a was then pattern-exposed in an exposure amount of 2,000 $J/m^2$ through a photomask by means of an i-line stepper (manufactured by Canon Inc., trade name: i5). Thereafter, the resist layer was developed with a 2.38% by mass aqueous solution of tetramethylammonium hydroxide to form an ink flow path pattern 3b prior to an insolubilization treatment (FIG. 3C).

A 10% by mass trimethylolpropane ethoxylate trivinyl ether solution as a coating agent was applied to the ink flow path pattern 3b prior to the insolubilization treatment by a spin coating method. Incidentally, as a solvent of the solution, was used a 50:50 (mass ratio) solvent of ethanol and ion-exchanged water. Thereafter, baking was conducted for 5 minutes at 140° C., and a washing treatment was conducted with ethanol to obtain an ink flow path pattern 3d whose surface had been subjected to the insolubilization treatment (FIG. 3D).

A photocationic polymerization type photosensitive resin composition composed of the following composition was then applied on the substrate 1 and the ink flow path pattern 3d whose surface had been subjected to the insolubilization treatment by a spin coating method. Incidentally, the photocationic polymerization type photosensitive resin composition was applied in such a manner that the film thickness on the ink flow path pattern 3d whose surface had been subjected to the insolubilization treatment was 10 μm. Thereafter, pre-baking was conducted for 2 minutes at 90° C. on a hot plate to form an ink flow path forming layer 4 (FIG. 3E).

EHPE (trade name, product of DAICEL 100 parts by mass CHEMICAL INDUSTRIES, LTD.)

SP-172 (trade name, products of ADEKA 5 parts by mass CORPORATION)

A-187 (trade name, product of Nippon Unicar Company, Limited) 5 parts by mass

Methyl isobutyl ketone 100 parts by mass.

The ink flow path forming layer 4 was then pattern-exposed in an exposure amount of 4,000 J/m² through a photomask by means of an i-line stepper (manufactured by Canon Inc., trade name: i5). Thereafter, PEB was conducted for 2 minutes at 120° C. on a hot plate. In addition, development was conducted with methyl isobutyl ketone, a rinsing treatment was conducted with isopropyl alcohol, and a heat treatment was conducted for 60 minutes at 100° C. to form an ink ejection orifice 5 (FIG. 3F). Incidentally, in this Example, an ink ejection orifice 5 having a diameter of 13 µm was formed.

An etching mask (not illustrated) having an opening shape of 1 mm in width and 24 mm in length was prepared on a back surface of the substrate 1 using a poly(ether amide) resin composition (product of Hitachi Chemical Co., Ltd., trade name: HIMAL). The substrate 1 was then immersed in a 22% by mass aqueous solution of tetramethylammonium hydroxide heated to 80° C. to conduct anisotropic etching for the substrate 1, thereby forming an ink supply port 6 (FIG. 3G). Incidentally, at this time, a protecting film (not illustrated, product of TOKYO OHKA KOGYO CO., LTD., trade name: OBC) was applied on the ink flow path forming layer 4 for the purpose of protecting the respective resin layers on the surface of the substrate 1 from the etchant to conduct the anisotropic etching.

The protecting film was then dissolved and removed with xylene. Thereafter, a Deep-UV exposure apparatus (manufactured by USHIO INC., trade name: UX-3200) was used to expose the whole surface of the substrate 1 in an exposure amount of 20,000 J/m². The substrate 1 was immersed in methyl lactate while applying ultrasonic waves to dissolve and remove the ink flow path pattern 3d whose surface had been subjected to the insolubilization treatment, thereby forming an ink flow path 3c (FIG. 3H).

After a step of cutting and separating the substrate 1 was conducted (not illustrated), a heat treatment was conducted for 60 minutes at 200° C. to completely cure the ink flow path forming layer 4. Thereafter, junction of a member for supplying an ink (not illustrated) and electrical junction for driving the energy-generating element 2 (not illustrated) were achieved to complete an ink jet head. The ink jet head was observed through a light microscope. As a result, deformation of the ink ejection orifice 5 and the ink flow path 3c was not observed. In addition, no resist residue was observed in the ink ejection orifice 5 and the ink flow path 3c.

Example 2

An ink jet head was produced in the same manner as in Example 1 except that a chemically amplified positive resist composed of the following composition was used as the positive resist to form a positive resist layer 3a.

| | |
|---|---|
| Polyhydroxystyrene 60% of the hydroxyl groups of which had been substituted by a tert-butyl group (compound represented by the following formula (4) (n:m = 60:40)) | 100 parts by mass |
| SP-172 (trade name, products of ADEKA CORPORATION) | 5 parts by mass |
| SP-100 (trade name, products of ADEKA CORPORATION) | 2 parts by mass |
| Ethyl lactate | 150 parts by mass. |

Formula (4)

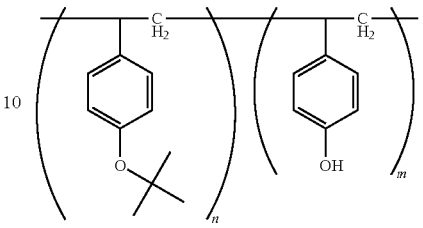

The ink jet head was observed through a light microscope. As a result, deformation of the ink flow path 3c was not observed, but the ink ejection orifice 5 was somewhat deformed, which was however such that no problem was caused in actual use. In addition, no resist residue was observed in the ink ejection orifice 5 and the ink flow path 3c.

Example 3

An ink jet head was produced in the same manner as in Example 1 except that a 10% by mass triethylene glycol divinyl ether solution was used as the coating agent in place of the 10% by mass trimethylolpropane ethoxylate trivinyl ether solution. Incidentally, the solvent of the solution was the same as in Example 1. The ink jet head was observed through a light microscope. As a result, deformation of the ink ejection orifice 5 and the ink flow path 3c was not observed. In addition, no resist residue was observed in the ink ejection orifice 5 and the ink flow path 3c.

Example 4

An ink jet head was produced in the same manner as in Example 1 except that a chemically amplified positive resist composed of the following composition was used as the positive resist to form a positive resist layer 3a.

| | |
|---|---|
| Polyhydroxystyrene 30% of the hydroxyl groups of which had been substituted by a tert-butyl group (compound represented by the formula (4) (n:m = 30:70)) | 100 parts by mass |
| Trimethylolpropane ethoxylate trivinyl ether | 100 parts by mass |
| TPS-1000 (trade name, products of Midori Kagaku Co., Ltd.) | 2 parts by mass |
| SP-100 (trade name, products of ADEKA CORPORATION) | 1 part by mass |
| Ethyl lactate | 150 parts by mass. |

The ink jet head was observed through a light microscope. As a result, deformation of the ink flow path 3c was not observed, but the ink ejection orifice 5 was somewhat deformed, which was however such that no problem was caused in actual use. In addition, no resist residue was observed in the ink ejection orifice 5 and the ink flow path 3c.

Example 5

An ink jet head was produced in the same manner as in Example 1 except that a chemically amplified positive resist composed of the following composition was used as the positive resist to form a positive resist layer 3a.

| | |
|---|---|
| Polyhydroxystyrene 30% of the hydroxyl groups of which had been substituted by a tert-butoxycarbonyl group (compound represented by the following formula (5) (n:m = 30:70)) | 100 parts by mass |
| Trimethylolpropane ethoxylate trivinyl ether | 100 parts by mass |
| TPS-1000 (trade name, products of Midori Kagaku Co., Ltd.) | 2 parts by mass |
| SP-100 (trade name, products of ADEKA CORPORATION) | 1 part by mass |
| Ethyl lactate | 150 parts by mass. |

Formula (5)

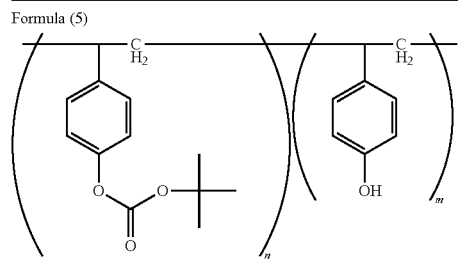

The ink jet head was observed through a light microscope. As a result, deformation of the ink flow path 3c was not observed, but the ink ejection orifice 5 was somewhat deformed, which was however such that no problem was caused in actual use. In addition, no resist residue was observed in the ink ejection orifice 5 and the ink flow path 3c.

Example 6

An ink jet head was produced in the same manner as in Example 4 except that a solution composed of the following composition was used as the coating agent, and diglyme was used to conduct a washing treatment, thereby forming the ink flow path pattern 3d whose surface had been subjected to the insolubilization treatment.

| | |
|---|---|
| Trimethylolpropane ethoxylate trivinyl ether | 10 parts by mass |
| Polymethyl methacrylate (weight-average molecular weight: 5,000) | 10 parts by mass |
| Diglyme | 80 parts by mass. |

The ink jet head was observed through a light microscope. As a result, deformation of the ink flow path 3c was not observed, but the ink ejection orifice 5 was somewhat deformed, which was however such that no problem was caused in actual use. In addition, no resist residue was observed in the ink ejection orifice 5 and the ink flow path 3c.

Example 7

An ink jet head was produced in the same manner as in Example 1 except that xylene was used as a solvent of the photocationic polymerization type photosensitive resin composition as the flow path forming material in place of methyl isobutyl ketone. The ink jet head was observed through a light microscope. As a result, deformation of the ink ejection orifice 5 and the ink flow path 3c was not observed. In addition, no resist residue was observed in the ink ejection orifice 5 and the ink flow path 3c.

Example 8

An ink jet head was produced in the same manner as in Example 1 except that diethylene glycol dimethyl ether was used as a solvent of the photocationic polymerization type photosensitive resin composition as the flow path forming material in place of methyl isobutyl ketone. The ink jet head was observed through a light microscope. As a result, deformation of the ink ejection orifice 5 and the ink flow path 3c was not observed. In addition, no resist residue was observed in the ink ejection orifice 5 and the ink flow path 3c.

Example 9

An ink jet head was produced in the same manner as in Example 2 except that a xylene solution of 1,2-dihydroxyanthraquinone was applied as a material absorbing the i-line to the ink flow path pattern 3b prior to the insolubilization treatment by a spin coating method before the coating agent was applied. The ink jet head was observed through a light microscope. As a result, deformation of the ink ejection orifice 5 and the ink flow path 3c was not observed. In addition, no resist residue was observed in the ink ejection orifice 5 and the ink flow path 3c.

Example 10

An ink jet head was produced in the same manner as in Example 4 except that a xylene solution of 1,2-dihydroxyanthraquinone was applied as a material absorbing the i-line to the ink flow path pattern 3b prior to the insolubilization treatment by a spin coating method before the coating agent was applied. The ink jet head was observed through a light microscope. As a result, deformation of the ink ejection orifice 5 and the ink flow path 3c was not observed. In addition, no resist residue was observed in the ink ejection orifice 5 and the ink flow path 3c.

Example 11

An ink jet head was produced in the same manner as in Example 5 except that a xylene solution of 1,2-dihydroxyanthraquinone was applied as a material absorbing the i-line to the ink flow path pattern 3b prior to the insolubilization treatment by a spin coating method before the coating agent was applied. The ink jet head was observed through a light microscope. As a result, deformation of the ink ejection orifice 5 and the ink flow path 3c was not observed. In addition, no resist residue was observed in the ink ejection orifice 5 and the ink flow path 3c.

Example 12

An ink jet head was produced in the same manner as in Example 6 except that a xylene solution of 1,2-dihydroxyanthraquinone was applied as a material absorbing the i-line to the ink flow path pattern 3b prior to the insolubilization treatment by a spin coating method before the coating agent was applied. The ink jet head was observed through a light microscope. As a result, deformation of the ink ejection orifice 5 and the ink flow path 3c was not observed. In addition, no resist residue was observed in the ink ejection orifice 5 and the ink flow path 3c.

Comparative Example 1

It was attempted to produce an ink jet head in the same manner as in Example 1 except that the insolubilization treatment was not conducted to the ink flow path pattern 3b prior to the insolubilization treatment. However, the ink flow path pattern 3b prior to the insolubilization treatment underwent pattern break down due to dissolution when the photocationic polymerization type photosensitive resin composition as the flow path forming material was applied on the ink flow path pattern 3b prior to the insolubilization treatment, so that subsequent steps could not be conducted.

Comparative Example 2

It was attempted to produce an ink jet head in the same manner as in Example 2 except that the insolubilization treatment was not conducted to the ink flow path pattern 3b prior to the insolubilization treatment. However, the ink flow path pattern 3b prior to the insolubilization treatment underwent pattern break down due to dissolution when the photocationic polymerization type photosensitive resin composition as the flow path forming material was applied on the ink flow path pattern 3b prior to the insolubilization treatment, so that subsequent steps could not be conducted.

Comparative Example 3

It was attempted to produce an ink jet head in the same manner as in Example 3 except that the insolubilization treatment was not conducted to the ink flow path pattern 3b prior to the insolubilization treatment. However, the ink flow path pattern 3b prior to the insolubilization treatment underwent pattern break down due to dissolution when the photocationic polymerization type photosensitive resin composition as the flow path forming material was applied on the ink flow path pattern 3b prior to the insolubilization treatment, so that subsequent steps could not be conducted.

Comparative Example 4

An ink jet head was produced in the same manner as in Example 4 except that the insolubilization treatment was not conducted to the ink flow path pattern 3b prior to the insolubilization treatment. The ink jet head was observed through a light microscope. As a result, deformation of the ink flow path 3c was observed.

According to the process of the present invention, a positive resist excellent in sensitivity and resolution is used in the production of an ink jet head, whereby an ink jet head can be provided without causing deformation of an ink flow path and an ink ejection orifice, and the remains of the resist.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-201016, filed Sep. 8, 2010, which is hereby incorporated by reference herein in its entirety.

What is claimed is:

1. A process for producing an ink jet head, comprising:
a step of forming an ink flow path pattern whose surface has been subjected to an insolubilization treatment on a substrate having an energy-generating element,
a step of applying a flow path forming material that cures by ultraviolet ray irradiation on the ink flow path pattern whose surface has been subjected to the insolubilization treatment and on the substrate to form an ink flow path forming layer,
a step of irradiating a part of the ink flow path forming layer with ultraviolet rays to conduct development, thereby forming an ink ejection orifice, and
a step of removing the ink flow path pattern whose surface has been subjected to the insolubilization treatment, thereby forming an ink flow path,
wherein the step of forming the ink flow path pattern whose surface has been subjected to the insolubilization treatment includes:
a step of applying a positive resist containing a resin having at least a phenolic hydroxyl group on the substrate to form a positive resist layer,
a step of patterning the positive resist layer to form an ink flow path pattern prior to the insolubilization treatment,
a step of applying a coating agent containing a compound having at least two vinyl ether groups on the ink flow path pattern, and
a step of heat-treating the ink flow path pattern coated with the coating agent.

2. The process according to claim 1, wherein the coating agent contains the compound having at least two vinyl ether groups and a solvent capable of dissolving the compound therein.

3. The process according to claim 2, wherein the coating agent further contains a resin which does not have a functional group that reacts with the vinyl ether group.

4. The process according to claim 1, wherein the positive resist contains a resin having a partially protected phenolic hydroxyl group, a crosslinking agent capable of reacting with the phenolic hydroxyl group to form a bond decomposable by an acid, and a compound generating an acid by light irradiation.

5. The process according to claim 4, wherein the resin having the partially protected phenolic hydroxyl group has a structure represented by the following formula (1) or (2):

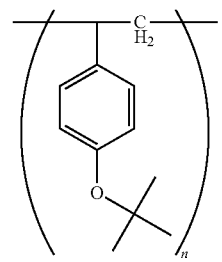

Formula (1)

where n in formula (1) is a positive integer,

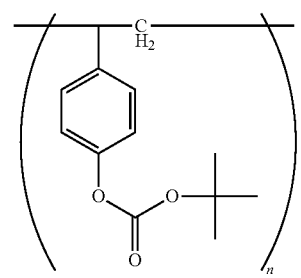

Formula (2)

where n in formula (2) is a positive integer.

6. The process according to claim 4, wherein the crosslinking agent is a compound having at least two vinyl ether groups.

7. The process according to claim 1, wherein the flow path forming material is a photocationic polymerization type photosensitive resin composition containing a cationically polymerizable resin having at least a cationically polymerizable group and a photocationic polymerization initiator.

8. The process according to claim 1, which comprises a step of applying a material that absorbs the ultraviolet rays applied in the step of forming the ink ejection orifice on the ink flow pass pattern prior to the insolubilization treatment or the ink flow pass pattern whose surface has been subjected to the insolubilization treatment.

9. The process according to claim 8, wherein the ultraviolet rays applied in the step of forming the ink ejection orifice are of the i-line, and the material that absorbs the ultraviolet rays is a material that absorbs the i-line.

10. The process according to claim 8, wherein the material that absorbs the ultraviolet rays is a compound having one or more phenolic hydroxyl groups.

* * * * *